United States Patent [19]

Thornton

[11] Patent Number: 5,070,216
[45] Date of Patent: Dec. 3, 1991

[54] EMI SHIELDING GASKET

[75] Inventor: Steven L. Thornton, Windham, N.H.

[73] Assignee: Chomerics, Inc., Woburn, Mass.

[21] Appl. No.: 515,898

[22] Filed: Apr. 27, 1990

[51] Int. Cl.$^5$ .......................... H05K 9/00; B32B 15/04
[52] U.S. Cl. ........................... 174/35 GC; 174/35 MS; 428/457; 428/463
[58] Field of Search ............. 428/457, 463; 174/35 R, 174/35 GC, 35 MS; 277/224, 225, 226, 227, 228, 2, 29, 234, 235 R, 235 A, 235 B, 901

[56] References Cited

U.S. PATENT DOCUMENTS

| | | | |
|---|---|---|---|
| 3,277,230 | 10/1966 | Stickney et al. | 174/35 |
| 3,446,906 | 5/1969 | Zulauf | 174/35 |
| 3,502,784 | 3/1970 | Kunkel | 174/35 |
| 3,504,095 | 3/1970 | Roberson et al. | 174/35 |
| 3,512,946 | 5/1970 | Hutkin | 29/195 |
| 3,700,368 | 10/1972 | Wells | 425/115 |
| 3,889,043 | 6/1975 | Ducros | 173/35 |
| 4,399,317 | 8/1983 | Van Dyk, Jr. | 174/35 GC |
| 4,434,541 | 3/1984 | Powers, Jr. | 174/35 GC |
| 4,572,921 | 2/1986 | May et al. | 174/35 GC |
| 4,857,668 | 8/1989 | Budnanno | 174/35 GC |
| 4,864,076 | 9/1989 | Stickney | 174/35 GC |

Primary Examiner—Leo P. Picard
Assistant Examiner—Bot L. Ledynh
Attorney, Agent, or Firm—John Dana Hubbard; William L. Baker

[57] ABSTRACT

An electrically conductive gasket comprised of a plastic substrate and a metal layer formed on at least one surface of the gasket. The gasket is preferably formed in a form such that it has an attachment portion and a contact portion. Preferably, the gasket is an EMI/RFI shielding gasket having a plurality of fingers extending outwardly from a center portion such that the metal layer of the gasket establishes an electrical connection between two substrates which require EMI/RFI shielding.

6 Claims, 1 Drawing Sheet

EMI SHIELDING GASKET

The present invention relates to a conductive gasket. More particularly, it relates to an EMI/RFI shielding gasket in the form of a metalized plastic fingerstock.

BACKGROUND OF THE INVENTION

RFI (radio frequency interference) and EMI (electromagnetic interference) is a problem that is commonly encountered in the design and operation of electronic equipment. EMI/RFI as it is commonly known, can cause electronic equipment to not function properly or not function at all. Today with the advent of fast, more powerful and high frequency operating electronic devices, the prevention of EMI/RFI is of paramount importance.

Typically, electronic equipment is designed to fit within a metallic cabinet which help to reduce the occurence of EMI/RFI. These cabinets or shells generally have openings, such as doors or panels which are removable so that the electronic equipment may be serviced or replaced. The discontinuity between the cabinet frame and the door or panel allows the EMI/RFI to pass into or out of the cabinet, thereby causing the failure of the electronic equipment in or around the cabinet.

One of the most commonly used EMI/RFI shielding materials is a metal strip known as fingerstock. Fingerstock generally is formed of beryllium copper or phosphor bronze and is bent into a V or U shape with a number of resilient elements or "fingers" extending out from the center of the material on at least one of the arms. Examples of such fingerstock are shown in U.S. Pat. No. 3,277,230; 3,504,095 and 4,572,921. Fingerstock is difficult to install and requires that a substantial closure or compression force be applied to it in order to achieve electrical continuity between the door or panel and the cabinet. Additionally, the fingerstock, being metal, is susceptible to fatigue causing the fingers to break off or to retain a permanent compression set. In either event, the shielding properties of the fingerstock is substantially degraded or destroyed. Metal fingerstock therefore requires routine and regular maintenance which adds to its cost.

Other alternatives to fingerstock include wire mesh covered elastomers, conductively filled elastomers and a spirally formed "O" ring type of gasket. Each of these materials provide adequate EMI/RFI shielding, however they require a high level of compression to ensure adequate electrical continuity between the substrates being joined. Additionally, these alternatives are more expensive to manufacture than fingerstock, making their use, especially in the consumer electronics market less acceptable.

The present invention provides an alternative to metal fingerstock which overcomes the shortfalls of fingerstock or the other alternatives mentioned above and which is inexpensive, simple to manufacture and apply.

SUMMARY OF THE INVENTION

The present invention relates to an EMI/RFI gasket which is attachable to one substrate of a structure to be shielded. The gasket is comprised of a plastic substrate or core having an attachment portion and a contact portion. At least the outer surface of the plastic substrate has a metallic conductive coating which provides the electrical continuity and thus EMI/RFI shielding to the structure.

The gasket of the present invention is comprised of a resilient plastic substrate in strip form upon which a metallic conductive surface is formed in a thickness and manner so as to be suitable for use in EMI/RFI shielding applications. Preferably, the gasket has a plurality of fingers integrally joined to the attachment portion, which fingers have an angular or bent profile so as to ensure a good contact with its mating surface.

The plastic substrate is preferably made in an extruded or molded form. The metallic layer may be adhered or compressed onto the surface of the plastic substrate or plated, sprayed or otherwise deposited onto the plastic substrate's surface.

DETAILED DESCRIPTION

Figure 1:
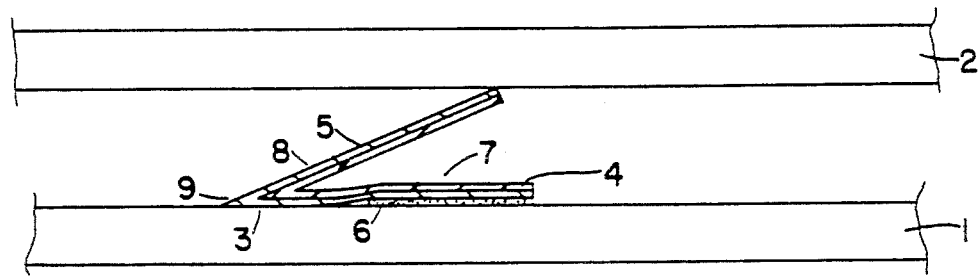
FIG. 1 is a cross sectional view of a preferred embodiment of the present invention in partial compression between two substrates which are movable relative to each other.

One preferred embodiment of the present invention is shown in FIG. 1. The two substrates to be shielded are shown as 1 and 2. For example, the first substrate 1 can be the frame of an electrical cabinet while the second substrate 2 can be a movable cover which mates to the first substrate and may be a door, panel, drawer, etc. A gasket 3, according to the present invention, is interposed between the first substrate 1 and the second substrate 2, so as to establish electrical continuity and EMI/RFI shielding between the two substrates 1 and 2.

The gasket 3, as depicted, is in the form of a "V", although as explained furtheron, the configuration of the gasket can be any suitable shape that is typically used in metal fingerstock gasketing and which provides the required EMI/RFI shielding capabilities. The gasket 3 is comprised of an inner plastic core or substrate 4 which has at least its outer surface coated or clad with an electrically conductive metallic layer 5. The metallic layer is permanently attached or formed upon the outer surface 4 of the gasket 3 and establishes the electrical continuity between the substrates when it is in contact with them. The gasket may be retained to the substrate by any suitable means. In the embodiment of FIG. 1, the gasket 3 is secured to the substrate 1 by an electrically conductive adhesive layer 6.

Figure 2:
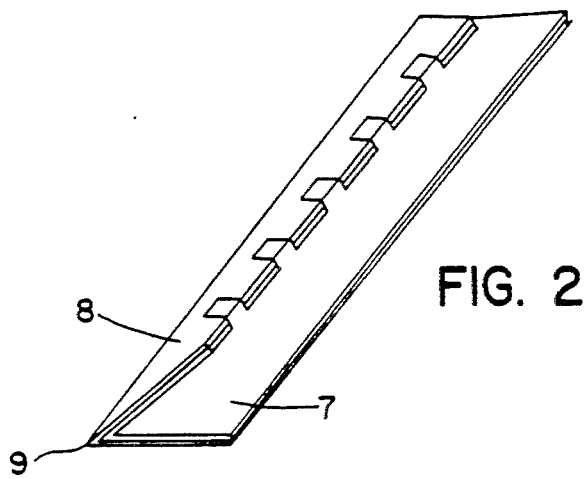
FIG. 2 is a perspective view of the gasket of FIG. 1 before it is inserted between the two substrates.

The gasket of the present invention is in the form of an elongated strip and consists of an attachment portion 7 and a contact portion 8. The contact portion 8 may be formed into a series of fingerlike segments, all of which are secured to the attachment portion 7, as shown in FIG. 2. Alternatively, the contact portion 7 may be continuous.

The contact portion 8 is preferably angled, bent, curved or otherwise configured so that it establishes an electrical, bearing contact with the second substrate 2 when the second substrate 2 is closed upon the first substrate 1. One preferred embodiment of the contact portion has the contact portion curving upwardly in a concave fashion such that the contact portion makes a secure contact with the second substrate.

The attachment portion 8 as shown in FIGS. 1 and 2 is connected to the contact portion 7 by a bent portion 9 which defines the junction between the contact and attachment portions. Other arrangements between the contact portion and attachment portions may also be used.

For example, FIGS. 3A-D show additional preferred cross-sectional configurations of gaskets made according to the present invention and the relative relationship between the contact and attachment portions of the gasket.

Figure 3A:
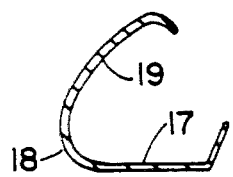
FIGS. 3A-3D are cross sectional views of other preferred gasket configurations.

FIG. 3A shows a C or U-shaped type of gasket configuration, having a contact portion 17 connected to the attachment portion 18 by a curved contoured portion 19.

Figure 3B:
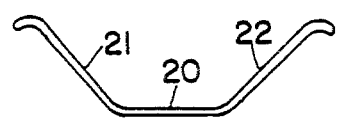

FIG. 3B shows another preferred configuration of the present invention wherein a flat central portion 20 has outwardly directed arms or fingers 21, 22 extending out from both sides of the central portion 20. This configuration can be mounted with the central portion 20 against the first substrate in such a manner that the tips of the arms 21 and 22 extend out from that substrate, or the gasket can be mounted in the reverse manner such that the arms are in contact with the first substrate. In either configuration the gasket is secured to the first substrate via the central portion.

Figure 3D:
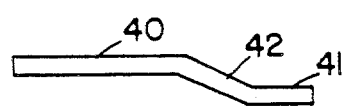
Figure 3C:
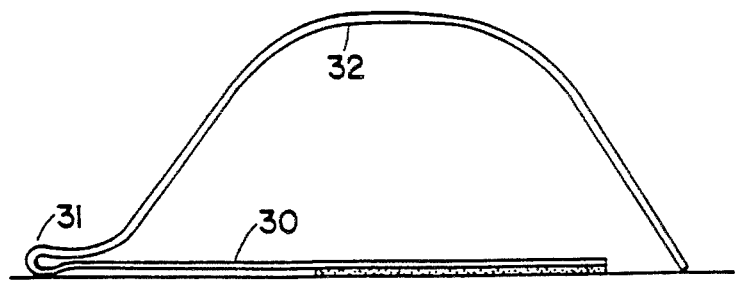

FIG. 3C shows another preferred configuration of the present gasket. It has a flat attachment portion 30 connected by a curved portion 31 to a bowed contact portion 32.

FIG. 3D shows a further embodiment of the present invention wherein the attachment portion 40 and the contact portion 41 are connected by an offset or angular portion 42 so as to ensure suitable contact between the two substrates. In this embodiment, it is preferred that both surfaces of the fingerstock have metallic outer layers.

The gasket may be attached to the substrate by a variety of securing means. Mechanical securing means may include screws, bolts, rivets, clips and other such fasteners and/or a retention means on or in the substrate such as channel which interacts with the gasket to secure it in place. One example of such a substrate based retention means is an undercut channel formed in the surface of the substrate. Alternatively, the gasket, if its cross-sectional profile allows, may be adhesively bonded to a substrate. The adhesive may be conductive or nonconductive if a means for establishing electrical continuity with the substrate can be achieved such as by coating only a portion of the gasket's surface with the nonconductive adhesive so that the gasket is still in electrical contact with the substrate. Preferably, the adhesive is pressure sensitive, such as a pressure sensitive acrylic adhesive. (More preferably, it is a pressure sensitive electrically conductive acrylic adhesive.) Other means for attaching the gasket include spot bonding and heat or solvent welding of the gasket to the substrate. The means of attachment is not critical so long as it securely fastens the gasket to the substrate and does not interfere with the electrical continuity between the mated surfaces.

The plastic substrate or core of the gasket is preferably formed of a flexible, resilient plastic material, preferably a thermoplastic material.

Suitable plastics include but are not limited to polyolefins such as polypropylene or polyethylene, various polyolefin copolymers such as ethylene-propylene copolymers, polyamides/imides, ethylene vinyl acetate copolymers, nylons, polyesters including polyethylene terephthatate, vinylchloride homopolymers and copolymers such as polyvinyl chloride, styrene based homopolymers and copolymers, and various thermoplastic rubbers such as Santoprene ® polymers available from Monsanto, which are a blend of rubber and thermoplastic polymers; and blends thereof.

The preferred plastic is one which has high creep resistance, a good spring rate, and a high resistance to fatigue and compression set. Additional factors which may influence the choice of plastic in a specific application include cost, platability and melting point and/or heat resistance of the selected plastic (for high temperature applications). One preferred plastic is a 50/50 blend of an ethylene vinyl acetate copolymer and polypropylene.

Thermoplastic materials are preferred for the present gasket as they allow one to extrude the desired cross sectional profile of the gasket as the plastic substrate is formed. Of course other methods of forming the plastic substrate and shaping it into the desired configuration may be used. For example, one can take a preformed plastic strip, heat it until it is soft and then mold the strip into the desired configuration. Alternatively, the substrate could be molded in the desired form from the beginning or depending upon the plastic used, it may cold molded into the desired form.

The conductive metallic layer is applied to at least one surface of the plastic substrate. In some configurations, it may be desired to have both the inner and outer surfaces of the plastic substrate covered by an electrically conductive metallic layer.

Any metal that is suitable for conducting electricity or which can be used in EMI/RFI shielding applications may be used in the present invention. Suitable metals include but are not limited to gold, silver, platinum, palladium, copper, aluminum, zinc, tin, nickel, iron, cobalt, mercury or chromium and various alloys of the above metals. Additionally, depending upon the means by which the metal layer is joined to the plastic substrate, the metal layer may comprise plated metal layers such as tinned aluminum, tinned copper or silver plated copper or aluminum.

The thickness of the metallic layer should be sufficient so that it will be electrically conductive in a manner sufficient to provide EMI/RFI shielding and which will remain joined to the plastic substrate's surface despite numerous applications and reapplications of a compressive force (such as occurs in the repeated opening and closing of a door on a cabinet). The layer should also be of a thickness such that it does not render the plastic substrate inflexible or non- resilient. Generally the layer should be of a thickness from about 0.0001 inch to 0.010 inch. Layers thinner than 0.0001 inch would tend to wear quickly, thereby prematurely reducing the shielding effectiveness and useful life of the gasket. Likewise, layers thicker than 0.010 inch may reduce the flexibility and resiliency of the gasket, do not add to the electrical conductivity or shielding effectiveness of the gasket and do not tend to provide any additional useful life to the gasket. Therefore, while layers thinner than 0.0001 inch or thicker than 0.010 inch can be used in the present invention, such thickness are not preferred.

The conductive metallic surface may be formed on the plastic strip in a variety of ways.

One preferred method is to adhere a conductive metal foil tape, such as CHO-FOIL ® tape, available from Chomerics, Inc. to at least the outer surface of the plastic substrate. The metal foil should cover at least a substantial portion of the outer surface and should always be formed so as to provide electrical continuity between the two surfaces which are being mated with the gasket. It is preferred that the foil cover at least the entire outer surface of the plastic substrate. Such a foil may be applied to the plastic substrate before or after it is formed into its folded configuration, although application after folding is preferred. The metal foil tape may have its own pressure sensitive adhesive layer which can be used to adhere the tape to the plastic substrate. Alternatively, one may use a separate adhesive, such as a pressure sensitive adhesive to bond a metal foil layer to the plastic.

Another preferred means for forming the conductive metal surface on the plastic substrate is to plate a metallic coating onto the outer surface of the plastic substrate. Various electroless and electroplating processes can be used to achieve this plated surface. It is preferred that the plating process occur after the substrate has been folded and formed into its final desired configuration (including the formation of the "fingers" if desired) so that the plated coating is not severely injured during processing. Additionally, if desired, one can plate additional conductive layers over the first layer so as to form a multilayered metallic coating. For example, it may be desirable to form a first layer of copper and a second layer of nickel or silver over the copper to prevent oxidation of the copper layer due to exposure to the atmosphere. Alternatively, one may plate a first coat of iron or a ferrous material and then plate a second layer of non corrosive, conductive metal such as silver, gold or nickel on top of the first layer.

A further means for forming the metallic layer on the plastic substrate is to heat bond a metal foil layer onto the outer surface of the plastic substrate. This may occur as the plastic substrate is being formed or subsequent to that operation. In either application, the Plastic substrate must be heated to a temperature at which the plastic begins to soften. The metal foil is then mated against the plastic layer and the two layers are pressed or crimped together to form a coherently clad product.

Additionally, other means for creating a metallic layer such as spraying a conductive metal containing layer, or vapor depositing such a metal layer onto the plastic substrate may also be used. Other means of depositing such a layer that would create a gasket having an EMI/RFI shielding capability and which are available to one skilled in the art can also be used.

The finger like protrusions if desired, can be formed on at least the bearing portion of the material. They may be formed during the formation of the plastic substrate, before the addition of the metallic surface or after the addition of the metallic surface. The use of the fingers is desirable in that it allows one to have a conductively shielded gasket which can conform to irregular or uneven surfaces between the opposing substrates. The type of finger selected can be any that is commonly used with metal fingerstock, such as rectangular with a flat or circular end, semicircular, oval, etc. Preferably, the length of the fingers, if used, extend across at least one half the width of the bearing section. More preferably, the fingers extend across most of the bearing portion and are linked to the attachment portion by either a common web or individually.

If desired, the attachment portion may also contain a series of fingers, which may be identical to those on the bearing or which may be of different design. Additionally, the fingers on the bearing section may be aligned so as to oppose those on the attachment section or they may be offset from those on the attachment section, preferably in an overlapping arrangement.

The fingers may be formed by any conventional method for shaping plastic. One such means is to die cut the series of fingers into the gasket and removing the cut out sections between the fingers. One may also mold the fingers into the plastic substrate if the substrate is formed by a molding process. Additionally, the use of a rotary die cutter may be used to form the series of interspaced fingers and spaces.

If the metallic layer is to be plated, sprayed or chemically deposited upon the plastic substrate, it is preferred that the fingers, if desired, be formed before the metallic layer is attached. If the metallic layer is in the form of a tape or foil laminate, then it is preferred to form the fingers after the metallic layer has been bonded to the plastic substrate.

EXAMPLE

A thermoplastic elastomer formed of a blend of an ethylene vinyl acetate copolymer and polypropylene was extruded in the form of a "V" similar to the embodiment of FIG. 1. A conductive tape, known as CHO-FOIL® tape, available from Chomerics, Inc., having a metal surface of tinned copper (0.003 inches thick) and pressure sensitive adhesive backing was placed over the outer surface of the extrusion and bonded to it. The width of the tape corresponded to the width of the outer surface of the extrusion. The gasket was mounted to an opening (14 inches by 14 inches). A metal mating cover was applied on top of the qasket so as to deflect the gasket by at least 10%. The gasket was tested for shielding performance and found to have a shielding effectiveness of 50 to 60 dBs at frequencies from 1 megahertz to 1 gigahertz.

The metallized fingerstock of the Example provides adequate shielding effectiveness for EMI/RFI shielding applications. It is easier to manufacture and does not have the disadvantages of metal fingerstock, such as being subjected to fatigue and permanent compression set.

While the present invention has been described with reference to its preferred embodiments, other modifications can achieve the same result. Variations and modifications of the present invention will be obvious to those skilled in the art and it is intended in the appended claims to cover all such modifications and equivalents as fall within the true spirit and scope of this invention.

What is claimed:

1. An EMI/RFI shielding gasket comprising an elongated strip of thermoplastic wherein the thermoplastic is a blend of ethylene vinyl acetate copolymer and polypropylene, the strip having two arms, each of the arms having an outer and inner surface, the outer surface of each of the arms having a layer of conductive metal bonded to it and wherein the metal is selected from the group consisting of gold, silver, platinum, palladium, copper, aluminum, zinc, tin, nickel, iron cobalt, mercury, chromium, tinned aluminum, tinned copper, silver plated copper and silver plated aluminum.

2. The EMI/RFI shielding gasket of claim 1 wherein one of the arms forms a bearing portion and the other arm forms an attachment portion.

3. The EMI/RFI shielding gasket of claim 2 wherein the bearing portion has a plurality of fingers.

4. The EMI/RFI shielding gasket of claim 1 wherein the two arms have a plurality of fingers.

5. The EMI/RFI shielding gasket of claim 1 wherein the metal layer is in a form selected from the group consisting of metal foils, metallic plated layers, sprayed metallically filled layers and vapor deposited metallic layers.

6. The EMI/RFI shielding gasket of claim 1 wherein the two arms form a V-shaped structure.

* * * * *